(12) United States Patent
Dobrovolny

(10) Patent No.: US 7,072,636 B2
(45) Date of Patent: Jul. 4, 2006

(54) PRINTED CIRCUIT DOUBLY BALANCED MIXER FOR UPCONVERTER

(75) Inventor: Pierre Dobrovolny, North Riverside, IL (US)

(73) Assignee: Zenith Electronics Corporation, Lincolnshire, IL (US)

( * ) Notice: Subject to any disclaimer, the term of this patent is extended or adjusted under 35 U.S.C. 154(b) by 783 days.

(21) Appl. No.: 09/863,709

(22) Filed: May 23, 2001

(65) Prior Publication Data

US 2001/0036818 A1 Nov. 1, 2001

Related U.S. Application Data

(63) Continuation-in-part of application No. 09/276,066, filed on Mar. 25, 1999.

(51) Int. Cl.
H04B 1/26 (2006.01)
H04B 1/28 (2006.01)

(52) U.S. Cl. .............. 455/313; 455/326; 455/328; 455/333

(58) Field of Classification Search ........... 455/313, 455/323, 326, 327, 332, 333, 339, 340, 286, 455/287, 290, 292, 293

See application file for complete search history.

(56) References Cited

U.S. PATENT DOCUMENTS

| | | | |
|---|---|---|---|
| 3,678,418 A * | 7/1972 | Woodward | 333/26 |
| 3,727,078 A * | 4/1973 | Wollesen | 327/113 |
| 4,063,176 A * | 12/1977 | Milligan et al. | 455/326 |
| 4,080,573 A * | 3/1978 | Howell | 455/318 |
| 4,306,311 A | 12/1981 | Igarashi | |
| 4,449,245 A * | 5/1984 | Rabe | 455/319 |
| 4,677,691 A * | 6/1987 | Scott | 455/318 |
| 5,006,811 A * | 4/1991 | Kruger | 329/354 |
| 5,060,298 A * | 10/1991 | Waugh et al. | 455/326 |
| 5,140,705 A * | 8/1992 | Kosuga | 455/318 |
| 5,175,885 A | 12/1992 | Lange et al. | |
| 5,280,648 A * | 1/1994 | Dobrovolny | 455/326 |
| 5,379,457 A * | 1/1995 | Nguyen | 455/323 |
| 5,428,839 A * | 6/1995 | Friesen et al. | 455/326 |
| 5,430,895 A | 7/1995 | Huusko | |
| 5,543,756 A * | 8/1996 | Anderson | 333/186 |
| 5,553,319 A * | 9/1996 | Tanbakuchi | 455/326 |
| 5,697,088 A * | 12/1997 | Gu | 455/307 |
| 5,732,345 A * | 3/1998 | Vice | 455/333 |
| 5,774,801 A | 6/1998 | Li et al. | |
| 5,777,527 A * | 7/1998 | Sanders | 333/26 |
| 5,917,386 A | 6/1999 | Dobrovolny | |
| 5,930,696 A * | 7/1999 | Tzuang et al. | 455/311 |
| 6,002,860 A * | 12/1999 | Voinigescu et al. | 703/14 |
| 6,009,318 A * | 12/1999 | Freed | 455/326 |
| 6,026,286 A * | 2/2000 | Long | 455/327 |
| 6,057,714 A * | 5/2000 | Andrys et al. | 327/105 |
| 6,118,992 A * | 9/2000 | Watanabe | 455/326 |
| 6,215,374 B1* | 4/2001 | Petrovic | 333/177 |

* cited by examiner

Primary Examiner—Duc M. Nguyen

(57) ABSTRACT

A doubly balanced upconverter mixer includes a local oscillator balun circuit comprising juxtaposed foil elements on opposite sides of an insulated substrate with electrical interconnections between the foil elements. An IF balun circuit also comprises series tuned and parallel tuned foil elements on opposite sides of the substrate in juxtaposition to each other. A diode switching network interconnects the baluns. A local oscillator signal is connected to the foil elements of the local oscillator balun circuit, an RF signal is coupled to one foil element of the IF balun circuit and an IF signal is taken from the other foil element of the IF balun circuit. Another embodiment incorporates MESFET type switches, the gates of which are supplied directly with a symmetrical local oscillator signal. This arrangement eliminates the need for the local oscillator balun.

10 Claims, 2 Drawing Sheets

PRINTED CIRCUIT DOUBLY BALANCED MIXER FOR UPCONVERTER

CROSS REFERENCE TO RELATED PATENT APPLICATIONS

This application is a Continuation in Part of application Ser. No. 09/276,066, filed Mar. 25, 1999, entitled PRINTED CIRCUIT DOUBLY BALANCED MIXER FOR UPCONVERTER and is related to application Ser. No. 08/815,561, filed Mar. 12, 1997, entitled PRINTED CIRCUIT TRANSFORMER HYBRIDS FOR RF MIXERS and application Ser. No. 09/275,949, entitled PRINTED SINGLE BALANCED DOWNCONVERTER MIXER, all in the name of the inventor and all assigned to Zenith Electronics Corporation.

BACKGROUND OF THE INVENTION

This invention relates to printed circuit foil elements used in equipment operating at UHF and higher frequencies and especially to such foil elements in broadband passive RF mixers (upconverters used in television and satellite receivers) that operate at frequencies in the gigaHertz range. As is well known, operation at such high frequencies make component configurations, overall circuit layout, lead lengths and lead placement extremely critical. This is one of the reasons conventional ferrite core coils and transformers are difficult to use in high frequency broadband RF mixer circuits. Another reason is the loss associated with the ferrite material. Normally, an RF mixer of this type incorporates up to three ferrite baluns. The present invention provides a doubly balanced RF mixer that utilizes the foil construction techniques of copending Application Ser. No. 08/815,561 for minimizing the number of ferrite baluns required and also for minimizing lead length problems, reducing losses and avoiding costly and time consuming labor.

OBJECTS OF THE INVENTION

A principal object of the invention is to provide an improved broadband RF mixer for operation in the gigaHertz range.

Another object of the invention is to provide a novel doubly balanced RF mixer for an upconverter that operates in the gigaHertz range.

A further object of the invention is to minimize the need for ferrite baluns in a broadband RF mixer.

BRIEF DESCRIPTION OF THE DRAWINGS

These and other objects and advantages of the invention will be apparent upon reading the following description in conjunction with the drawings, in which.

DETAILED DESCRIPTION OF THE INVENTION

Figure 1:
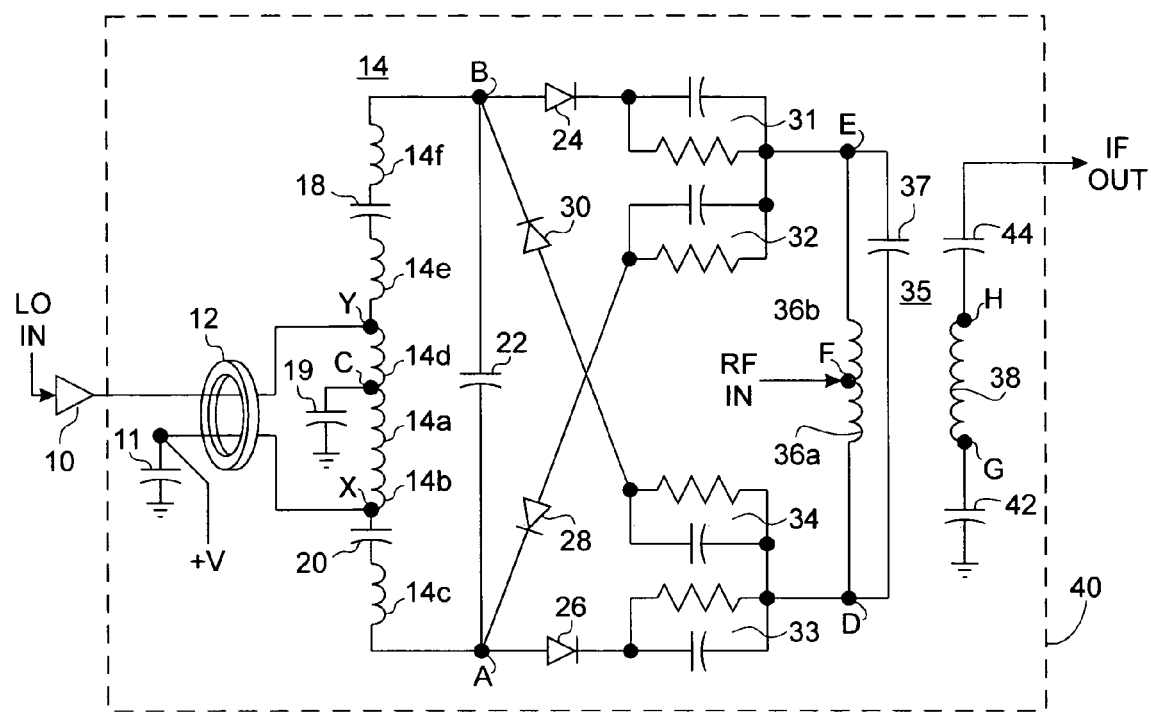
FIG. 1 is a simplified schematic diagram of an RF upconverter mixer constructed in accordance with the invention that eliminates two ferrite baluns.
Figure 2:
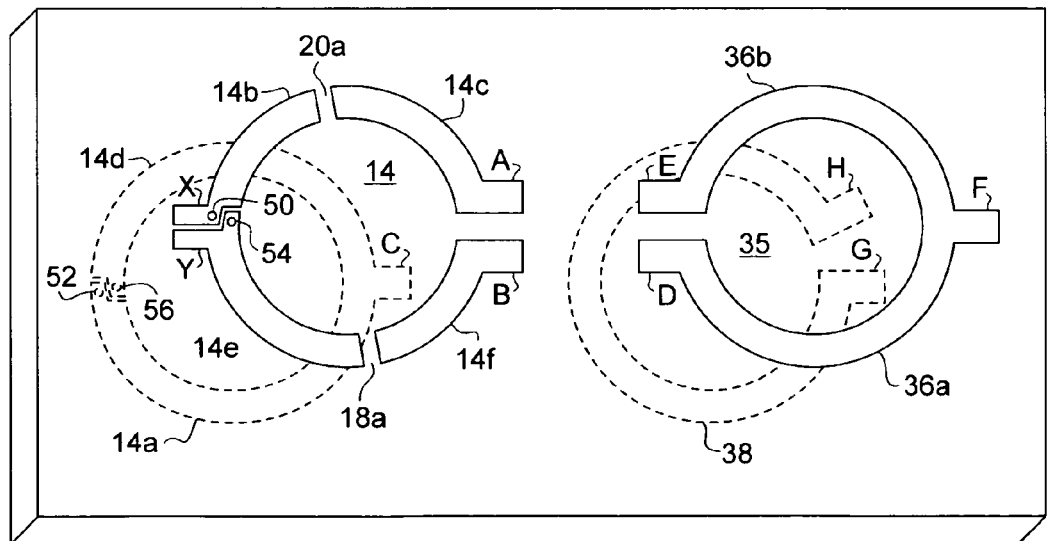
FIG. 2 is an exploded view illustrating the placement of the printed circuit board foil elements of the RF upconverter mixer of FIG. 1.

Referring to FIGS. 1 and 2, an RF upconverter mixer circuit includes a buffer amplifier 10 that is supplied with a local oscillator signal (LO) and which is coupled to terminals X and Y of a circuit 14 through a conventional ferrite balun 12, one end of which is returned to a ground source through a capacitor 11. Those skilled in the art will appreciate that balun 12 will generally comprise a bifilar winding and a ferrite core. Balun 12 is connected intermediate a pair of end terminals A and B of a circuit 14. Circuit 14 includes a center tap C that is connected to a ground source through a capacitor 19. Circuit 14, which consists of a plurality of annular foil elements 14a–14f, as shown in FIG. 2, functions as an LO balun, thereby eliminating the need for a conventional ferrite core balun. (The terms "printed", "foil" and "printed foil" as used herein and in the claims should be understood to include metallic foil elements that are printed, deposited, etched or affixed in any manner to an insulating surface or substrate.) A capacitor 22 is connected across terminals A and B for tuning out the inductance of LO balun circuit 14 at the LO signal frequency. A source of DC voltage +V is connected to the junction of capacitor 11 and balun 12 for supplying DC operating power to buffer amplifier 10 through balun 12 and a portion of LO balun circuit 14.

A mixer diode network, consisting of diodes 24, 26, 28 and 30, is connected between terminals A and B of LO balun circuit 14, through R/C diode self biasing networks 31, 32, 33 and 34, to the terminals E and D of another circuit 35 that consists of metallic foil elements that function as an intermediate frequency (IF) balun. IF balun circuit 35 consists of an annular foil element 36 that is center tapped to form two foil elements 36a and 36b, the junction F of which is connected to receive an RF input signal, and another foil element 38 that is used to couple out the IF signal. The upconverter mixer is shown on a double-sided insulated substrate 40, as is indicated in dashed lines. As is well known, the symmetrical local oscillator signal causes ON/OFF commutation of the pairs of diodes 24,28 and 26,30 which produces alternating high and low impedances at terminals D and E. The result is the well known heterodyning of the RF input signal and the LO signal for producing the IF signal.

In FIG. 2, the foil elements 14a–14f of LO balun circuit 14 are juxtaposed on opposite sides of insulated substrate 40. The insulated substrate preferably comprises a thin glass, ceramic or Teflon filled printed circuit board upon which the foil elements are printed, etched or otherwise formed by conventional printed circuit techniques. Thus foil elements 14b,14c and 14e,14f are on one side of substrate 40 and foil elements 14a and 14d are on the other side. Foil elements 14a and 14b are interconnected via plated-through holes 46a,46b and foil elements 14d and 14e are interconnected via plated-through holes 48a,48b. It should be noted that, while plated-through holes are in the preferred construction of the invention, other types of interconnections may also be employed. Foil elements 14b and 14c are slightly separated on substrate 40 to form a gap 20a for connection of an isolating capacitance 20 and foil elements 14e and 14f are similarly separated on the substrate to form a gap 18a for connection of an isolating capacitance 18. The gaps and isolating capacitances have no effect on the operation of the mixer at RF frequencies, and are used to isolate the mixer diodes from DC current flow.

Even mode LO current flow proceeds via terminal A, through foil elements 14c,14b, through plated-through holes 46a,46b, through foil element 14a to terminal C. The even mode LO return current flow in the other foil elements proceeds via terminal B, through foil elements 14f,14e, through plated-through holes 48a,48b, through foil element 14d to terminal C. The current flow for the LO is thus seen to be in the same direction in the overlying foil elements and the LO balun circuit 14 exhibits a high impedance between terminals A,B. The combined diode impedance appearing between terminals A,B is reduced to a value about four times smaller at terminals X,Y, thus yielding a convenient impedance value relative to the balun 12 and buffer amplifier 10. Capacitor 22, together with the diode capacitances and the inductance of foil elements 14a–14f, form a low Q (and thus broadband) parallel resonant circuit that is tuned to the center of the LO band. The odd mode RF current flow through foil elements 14a–14f provides f or a low impedance return path between terminals A and B and ground, respectively, necessary for the commutation of the RF signal applied to terminal F and alternatively switched through diode pairs 26,30 and 24,28, respectively, to ground.

The IF balun circuit 35, which is also disposed on substrate 40, includes foil elements 36a and 36b that are connected between terminals D and E and which are supplied with the RF signal at their junction (terminal F). A capacitor 37 parallel tunes the inductance of foil elements 36a, 36b to the IF frequency. The IF balun circuit 35 also includes foil element 38, having end terminals G and H, disposed on the opposite side of substrate 40 juxtaposed to foil elements 36a and 36b. Foil element 38 is in mutual inductance relationship with foil elements 36a and 36b and, as mentioned previously, the IF output signal is taken therefrom. A capacitor 42 connects end terminal G to ground and a capacitor 44 is connected to end terminal H. Capacitors 42 and 44 series tune the inductance of foil element 38 to the IF output signal frequency that is present in the heterodyne products. It will be appreciated that the IF balun circuit 35 has a wideband RF response and a narrow band IF response due to the series resonance of foil element 38 and capacitors 42 and 44 and the parallel resonance of foil elements 36a and 36b and capacitor 37. The narrow band IF response eliminates the need for various filtering arrangements found in high frequency prior art mixers. The wideband RF response (from VHF to UHF and up to gigaHertz frequencies involved) necessitates the use of miniature components, such as those obtainable with the use of foils and substrates.

Figure 3:
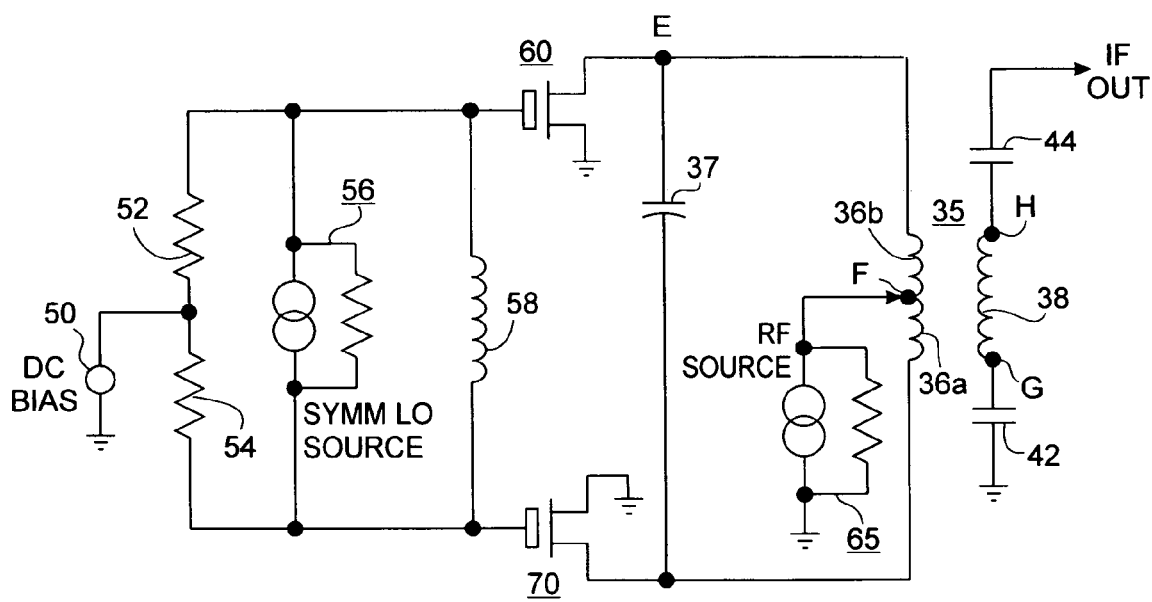
FIG. 3 is a simplified schematic diagram illustrating an RF upconverter that utilizes electronic switches and a symmetrical LO input signal which minimizes the total number of baluns.

The arrangement of FIG 3 differs from that of FIG. 1 in that the diode switching network has been replaced by MESFET or other fast acting type electronic switches 60 and 70, the use of which (in conjunction with a symmetrical LO signal input) also eliminates the need for the LO balun 14. A source of DC bias 50 is provided for the MESFET switches. In particular, the DC bias is supplied to the control electrodes (gates) of the MESFET switches 60 and 70 through resistors 52 and 54. A symmetrical source of LO signal 56 is coupled across the control electrodes of the MESFET switches 60 and 70. An inductor 58 is provided for tuning out the gate capacitances of the switches. An output electrode of each of the MESFET switches 60 and 70 is connected directly to ground and a third electrode of each is connected to point D and to point E, respectively. The tuned IF balun circuitry 35 is identical to that shown and discussed in the arrangement of FIG 1. A source 65 of RF signal is connected to terminal F that connects to elements 36a and 36b of the IF balun 35. The MESFET switches 60 and 70 may, for example, comprise off-the-shelf devices identified by Infineon, (formerly Siemens) part number CMY 210. The use of the MESFET switches (and other types of equivalent electronic switches) and the use of a symmetrical LO signal simplifies the circuitry (eliminating the need for LO balun 14 in FIG. 1 as an RF return path). It will be appreciated that the need for the DC bias source 50 will be determined by the particular implementation of the switching devices that is employed.

It should be understood that the other elements of the circuit of FIGS. 1 and 3 are preferably miniaturized and adapted to printed circuitry. The buffer amplifier 10 and the various discrete resistors and capacitors are preferably of the surface mount type. The mixer diodes 24, 26, 28 and 30 may similarly comprise a surface mount quad diode pack and the interconnections between the circuit elements may be printed circuit micro striplines. The balun 12 is a miniature ferrite core device that is soldered in place on substrate 40. The MESFET switches 60 and 70 and compensation inductor 58 are similarly mounted directly on the substrate. While none of these elements is illustrated in FIG. 2 for the sake of clarity, it should be understood that they are all located on one side or the other of substrate 40. It will also be noted that with the circuit of FIG. 3, the balun 14 (left-hand side of substrate 40 in FIG. 2) is not required and substrate 40 is reduced to the right hand portion (balun35) only.

The RF mixer circuits described above operate in accordance with well-known principles to mix an incoming RF signal with a local oscillator signal to generate a higher frequency or upconverted IF output signal for further processing. The printed circuit and the construction techniques for the various foil elements, in conjunction with the use of a miniature surface mounted amplifier and mixer diode pack, in one embodiment or MESFET switches in the other embodiment, and surface mounted capacitors and resistors makes for a small, economical and reproducible doubly balanced passive RF mixer, with low distortion and having a narrow band IF response, for use in the gigaHertz frequency range.

What has been described is a novel printed circuit construction for a doubly balanced RF mixer that is operable in the gigaHertz and higher frequency range. It is recognized that numerous changes in the described embodiment of the invention will occur to those skilled in the art without departing from its true spirit and scope. The invention is to be limited only as defined in the claims.

The invention claimed is:

1. A double balanced mixer comprising:
   a source of a symmetrical local oscillator signal;
   a switching circuit controlled by said local oscillator signal;
   a source of RF signal; and,
   a printed output circuit having a wideband response for receiving said RF signal and connected to said switching circuit for producing a narrow band IF output signal comprising the frequency difference between said local oscillator signal and said RF signal, wherein said output circuit includes parallel tuned elements exhibiting said wideband response and series tuned elements exhibiting said narrow band response.

2. A double balanced mixer comprising:
   a source of a symmetrical local oscillator signal;
   a switching circuit controlled by said local oscillator signal;
   a source of RF signal; and
   a printed output circuit having a wideband response for receiving said RF signal and connected to said switching circuit for producing a narrow band IF output signal comprising the frequency difference between said local oscillator signal and said RF signal, wherein said printed output circuit includes a printed balun, wherein the printed balun comprises first and second foil elements, wherein the first foil element is coupled to the switching circuit and to the RF signal source, and wherein the second foil element is displaced from the first foil element and produces the IF output signal.

3. The mixer of claim 2 wherein said switching circuit comprises first and second switches, each having a control terminal connected to receive said local oscillator signal, an output terminal and a third terminal connected to ground, said first and second switches being alternately turned on and off in response to said local oscillator signal.

4. The mixer of claim 3, wherein said first and second switches comprise MESFET devices, each having a gate electrode corresponding to said control electrodes, respectively.

5. The mixer of claim 2, further including an insulated substrate, wherein the first foil element and the second foil element are displaced on opposite sides of the insulated substrate.

6. The mixer of claim 5, wherein said first foil element is in a parallel tuned circuit and said second foil element is in a series tuned circuit.

7. The mixer of claim 5, wherein said switching circuit comprises first and second switches, each having a control terminal connected to receive said local oscillator signal, an output terminal and a third terminal connected to ground, said first and second switches being alternately turned on and off in response to said local oscillator signal.

8. The mixer of claim 7, wherein said first and second switches comprise MESFET devices, each having a gate electrode corresponding to said control electrodes, respectively.

9. A double balanced mixer comprising:
a source of a symmetrical local oscillator signal;
a switching circuit controlled by said local oscillator signal, said switching circuit comprising first and second MESFET switches, each having a gate electrode connected to receive said local oscillator signal, an output terminal and a third terminal connected to ground;
said first and second MESFET switches being alternately turned on and off in response to said local oscillator signal;
a source of RF signal;
an insulated substrate; and
a printed output circuit having a wideband response for receiving said RF signal and connected to said switching circuit for producing a narrow band IF output signal comprising the frequency difference between said local oscillator signal and said RF signal;
said printed output circuit including a printed IF balun having a first foil element, in a parallel tuned circuit, connected across said output terminals and a second foil element, in a series tuned circuit, displaced from said first foil element on opposite sides of said insulated substrate.

10. A double balanced mixer comprising:
a local oscillator signal input that receives a local oscillator signal;
an RF signal input that receives an RF signal;
an IF output;
a switching circuit controlled by the local oscillator signal; and,
a printed output circuit having a wideband response for receiving, the RF signal and connected to the switching circuit for producing a narrow band IF output signal at the IF output, wherein the narrow band IF output signal comprises the frequency difference between the local oscillator signal and the RF signal, wherein the printed output circuit comprises a balun having an input balun element and an output balun element, wherein the input balun element is coupled to the switching circuit and to the RF signal input, and wherein the output balun element is coupled to the IF output.

* * * * *